(12) United States Patent
Meikle et al.

(10) Patent No.: US 6,218,295 B1
(45) Date of Patent: Apr. 17, 2001

(54) SEMICONDUCTOR STRUCTURE WITH A TITANIUM ALUMINUM NITRIDE LAYER AND METHOD FOR FABRICATING THE SAME

(75) Inventors: Scott G. Meikle, Boise, ID (US); Sung Kim, Pflugerville, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/138,793

(22) Filed: Aug. 24, 1998

Related U.S. Application Data

(62) Division of application No. 08/643,420, filed on May 8, 1996.

(51) Int. Cl.⁷ .................................................. H01L 21/44
(52) U.S. Cl. .................... 438/653; 438/658; 438/661; 438/663
(58) Field of Search ................................. 438/658, 653, 438/660, 661, 663, 688

(56) References Cited

U.S. PATENT DOCUMENTS

| | | |
|---|---|---|
| 4,855,798 | 8/1989 | Imamura et al. ............... 357/71 |
| 5,047,367 | 9/1991 | Wei et al. ..................... 437/200 |
| 5,231,306 * | 7/1993 | Meikle et al. ................ 257/751 |
| 5,236,868 | 8/1993 | Nulman ....................... 437/190 |
| 5,344,792 | 9/1994 | Sandhu et al. ................ 437/200 |
| 5,416,045 | 5/1995 | Kauffman et al. ............. 437/174 |
| 5,432,128 * | 7/1995 | Tsu . | 
| 5,679,980 | 10/1997 | Summerfelt ................... 257/751 |
| 5,703,403 | 12/1997 | Sobue et al. ................. 257/751 |
| 5,729,054 | 3/1998 | Summerfelt et al. .......... 257/751 |
| 5,877,557 * | 3/1999 | Zawaideh ..................... 257/748 |

FOREIGN PATENT DOCUMENTS 60-251663 * 12/1985 (JP) .

* cited by examiner

*Primary Examiner*—Caridad Everhart
(74) *Attorney, Agent, or Firm*—Schwegman, Lundberg, Woessner & Kluth, P.A.

(57) ABSTRACT

A semiconductor device having a contact layer and a diffusion barrier layer is fabricated by preparing a semiconductor substrate, forming a layer of titanium/aluminum alloy on the surface of the substrate and then heating the resultant structure in a nitrogen ambient to form a contact layer of titanium silicide interposed between the substrate and a diffusion barrier layer consisting of titanium/aluminum/nitride.

49 Claims, 2 Drawing Sheets

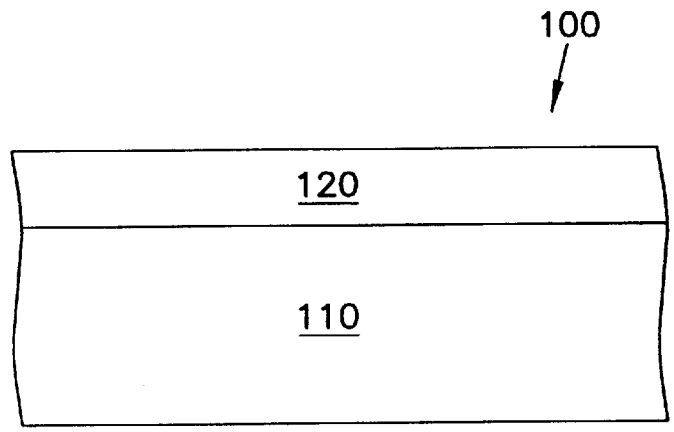
FIG. 1A
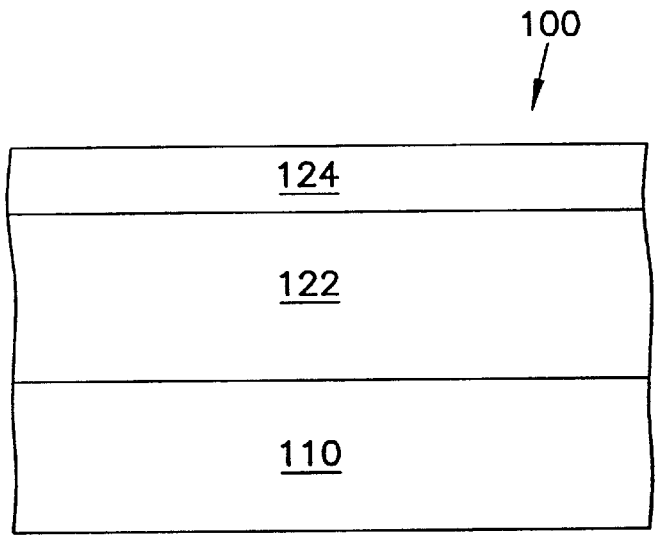
FIG. 1B
| CONTROL | EXPERIMENTAL |
|---|---|
| 14.1 KILO-OHMS | 20.3 KILO-OHMS |
| 14.1 KILO-OHMS | 21.4 KILO-OHMS |
| 16.2 KILO-OHMS | 23.7 KILO-OHMS |
FIG. 3

SEMICONDUCTOR STRUCTURE WITH A TITANIUM ALUMINUM NITRIDE LAYER AND METHOD FOR FABRICATING THE SAME

This application is a divisional of U.S. patent application Ser. No. 08/643,420, filed May 8, 1996 (the '420 application). The '420application is incorporated herein by reference.

FIELD OF THE INVENTION

The present invention relates in general to fabricating semiconductor devices, and particularly to a new method for fabricating a diffusion barrier layer consisting of a titanium/aluminum/nitride alloy.

BACKGROUND OF THE INVENTION

Integrated circuits, commonly referred to as semiconductor devices, are fabricated from materials with varying electrical properties. The materials fall into one of three general groupings: electrical conductors, such as aluminum; electrical semiconductors, such as silicon; and electrical nonconductors, such as silicon dioxide. One step in manufacturing semiconductor devices is metallization. which refers to the formation of metal films used for interconnections, ohmic contacts, and rectifying metal/semiconductor contacts. Aluminum and tungsten are commonly used for metallization due to their low resistivity. In state-of-the art semiconductor device architecture it is common for the metallization process to result in interfaces between silicon and the metal. It is well known that even at room temperature the metal and silicon will inter-diffuse over time. The dissolution of silicon into the metal also occurs when the device is annealed because the elements are subject to an elevated temperature, causing a rapid interdiffusion of the metal and the silicon. Interdiffusion of the two materials changes the semiconductive properties of the silicon and causes defective devices.

In order to control the interdiffusion it is common practice to manufacture a diffusion barrier at metal/silicon interfaces in semiconductor devices. One method used to minimize the dissolution of the silicon is to add silicon to the metal by co-sputtering until the amount of silicon contained by the metal satisfies the solubility requirement. Another method of satisfying the silicon requirements of the metal film is to deposit the film on a layer of doped polysilicon. A third method is to introduce a barrier metal between the metal film and the silicon substrate. To be effective the barrier metal must form a low contact resistance with silicon, it must not react with silicon, and its deposition and formation must be compatible with the overall process. A thin film of titanium nitride or titanium tungsten is commonly used in this method and provides an adequate barrier. These and other conventional diffusion barriers, while generally effective at room temperature, tend to fail at more elevated temperatures. Many of the preferred semiconductor fabrication processes, such as deposition, reflow, and annealing, require elevated temperatures. Conventional diffusion barriers can therefore limit the range of processes available for fabricating a semiconductor device.

More recently, it has been found that an alloy material composed of titanium, aluminum, and nitrogen is a promising material for barrier applications in semiconductor manufacturing. Titanium/aluminum/nitride has a lower resistivity than titanium nitride and is more compatible with high temperature processing. This material is described in U.S. Pat. No. 5,231,306, granted Jul. 27, 1993 to Meikle et al., entitled "TITANIUM/ALUMINUM/NITROGEN MATERIAL FOR SEMICONDUCTOR DEVICES", and assigned to the same assignee, the details of which are incorporated by reference. Meikle teaches a method of manufacturing titanium/aluminum/nitride by cosputtering titanium and aluminum or sputtering a titanium/aluminum alloy in a nitrogen or nitrogen/argon ambient. Titanium/aluminum/nitride is more effective than conventional barriers, especially at elevated temperatures. The reactive sputter process is, however, slower and more expensive than other conventional deposition techniques. With the ever-growing demand for semiconductor devices and the need to minimize manufacturing costs there is a need to be able to manufacture a titanium/aluminum/nitride diffusion barrier using conventional deposition techniques.

The advantages of building smaller semiconductor devices containing more circuitry are well known: electronic equipment becomes less bulky, reducing the number of solder or plug connections improves reliability, assembly and packaging costs are minimized, and circuit performance is improved, in particular higher clock speeds. In order to manufacture smaller devices with more circuits, each of the individual circuit elements are smaller. This creates a need for a diffusion barrier which is thinner while retaining its effectiveness at elevated, temperatures. It also creates a need for materials with low resistivity in order to minimize the power requirements.

Silicides make up one class of materials which have low resistivity and form a very stable interface with common substrate materials. Titanium suicide in particular is a silicide which has been shown to provide very low resistivity. Silicides such as titanium silicide are expected to play an increasingly important role in future metallization. Current processes known in the art for manufacturing titanium silicide include depositing the titanium on polysilicon (or silicon) and sintering the structure to form a silicide., by co-depositing the titanium and silicon by simultaneous sputtering or evaporation, or through chemical vapor deposition.

The present invention describes a new technique of forming titanium aluminum/nitride without having to resort to the slower and more expensive reactive sputter process. Furthermore, the new method has the added benefit of allowing simultaneous formation of titanium silicide which provides low contact resistance when the material is sputtered onto a silicon substrate. As a result the number of manufacturing steps is decreased.

SUMMARY OF THE INVENTION

The present invention provides a titanium/aluminum/nitride diffusion barrier for preventing interdiffusion at a metal/silicon interface within a semi-conductor device. A titanium silicide layer between the diffusion barrier and the substrate is also created at the same time the diffusion barrier is manufactured.

According to one aspect of the method of the present invention, a semiconductor device is provided, the device comprising a substrate, a contact layer, and a diffusion barrier layer. The contact layer is interposed between the substrate and the barrier layer. The substrate is silicon, but in other embodiments may employ any other form of silicon or silicon compound or any other doping of silicon that is known in the art. The contact layer consists of titanium silicide, and the diffusion barrier layer is comprised of a titanium, aluminum, and nitrogen alloy. In one embodiment the percentage of materials in the barrier layer are: 0 to 25% aluminum, 25 to 55% titanium, and 40 to 55% nitrogen. The thickness of the diffusion barrier is approximately 20% of the as-deposited film thickness. The thickness of the contact layer is approximately 150 to 250% of the as-deposited film thickness.

In accordance with another aspect of the invention, a process of fabricating a semiconductor device is provided, comprising the steps of preparing a semiconductor substrate and then forming a layer of titanium/aluminum alloy over the semiconductor substrate. The alloy is nitridized by annealing in a nitrogen-containing gas ambient. According to another aspect of the method of the present invention, the nitridizing step comprises furnace annealing in a nitrogen ambient. According to y-et another aspect of the method of the present invention, the nitridizing step comprises rapid thermal annealing in a nitrogen-containing gas ambient. In one embodiment the rapid thermal anneal time is between 0.1 and 2 minutes. In another embodiment the anneal temperature is between 500 and 900° C. and in yet another embodiment the temperature is maintained at 700° C. The nitridizing step produces a titanium silicide layer interposed between the substrate and a titanium/aluminum/nitride diffusion barrier layer.

The invention provides a method of manufacturing a diffusion barrier which provides better protection against diffusion than conventional diffusion barriers. The invention provides the added advantage of creating a low resistivity contact layer with no additional manufacturing steps.

BRIEF DESCRIPTION OF THE DRAWINGS

FIG. 1A is a cross section of a portion of a semiconductor device showing a layer of titanium/aluminum alloy deposited on a silicon substrate before the device has been annealed, according to one embodiment of the present invention.

FIG. 1B is a cross section of a portion of a semiconductor device showing a diffusion layer and a contact layer deposited on a silicon substrate after the device has been annealed, according to one embodiment of the present invention.

FIG. 3 is a table showing contact resistance data from three separate one hundred contact strings of p+contacts.

DESCRIPTION OF THE EMBODIMENTS

Figure 2:
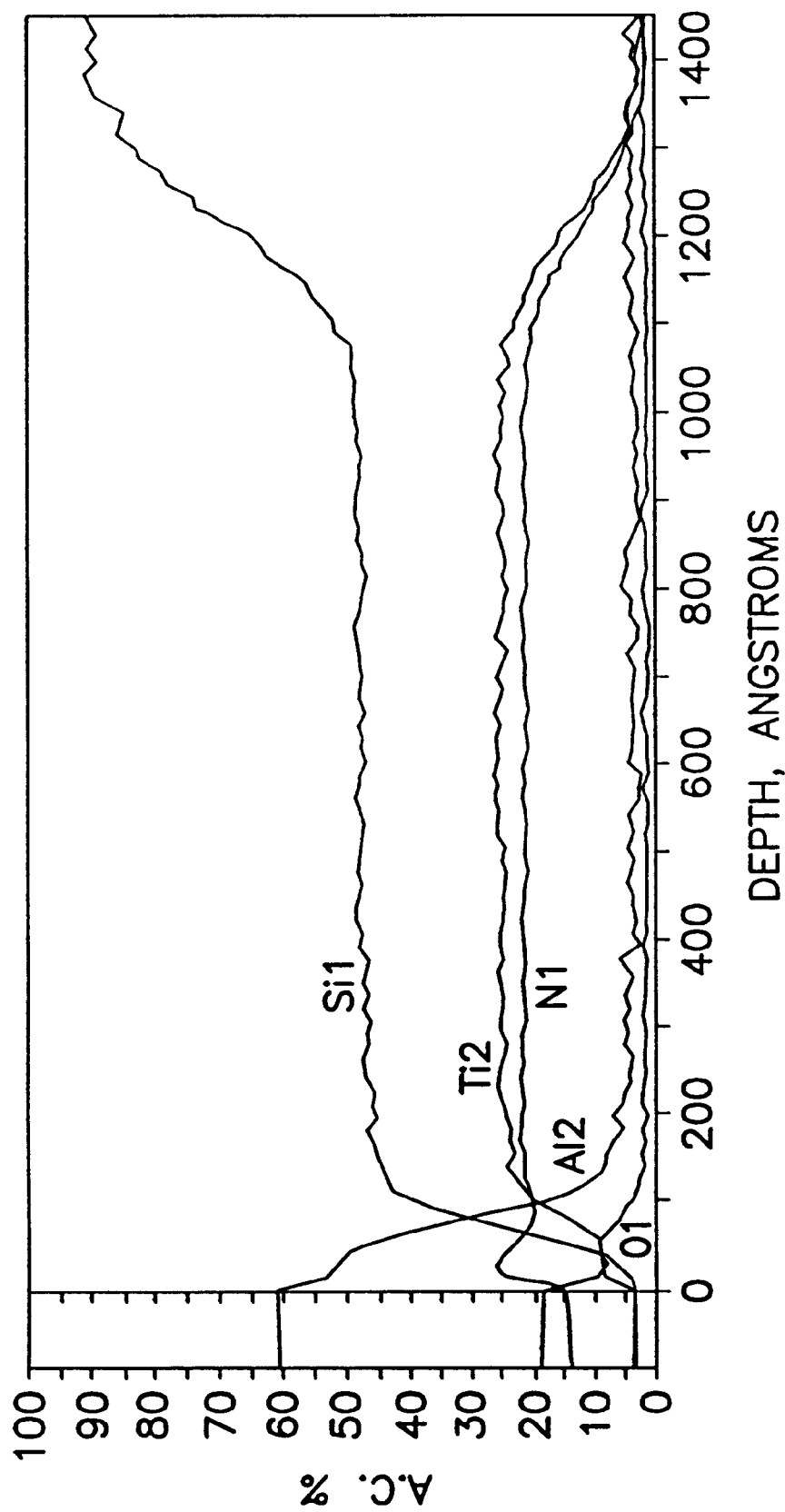
FIG. 2 is a graph showing auger electron spectroscopy data of a Ti/Al alloy after high temperature rapid thermal annealing.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural logical and electrical changes may be made without departing from the spirit and scope of the present invention. The following detailed description is, therefore, not to be taken in a limiting sense, and the scope of the present invention is defined by the appended claims.

The steps of the present invention are represented in FIGS. 1A and 1B. The shown semiconductor device embodying the invention is comprised of a substrate of lightly P-doped single crystal silicon 110. It is to be understood that the present invention also applies to any other form of silicon or silicon compound or any other doping of silicon that is known in the art. FIG. 1A shows a layer of titanium/aluminum alloy 120 deposited on the silicon substrate 110. In this embodiment the alloy layer 120 is about 500 angstroms thick. The semiconductor device 100 is rapid thermal annealed at 500° C. for five minutes in a nitrogen ambient. In another embodiment the temperature is between 500 and 900° C. In yet another embodiment the temperature is maintained at 700° C. and the anneal time is between 0.5 and 3 minutes. Furnace annealing in a nitrogen ambient may be used in an alternate embodiment. FIG. 1B shows the results. Annealing causes the aluminum within the alloy 120 to move to the surface and form a diffusion barrier layer 124 comprised of titanium, aluminum and nitrogen. Interposed between the barrier layer 124 and silicon substrate 110 is a contact layer 122 comprised of 10 titanium silicide. The thickness of the diffusion barrier is approximately 20% of the as-deposited film thickness, and the thickness of the contact layer is 150 to 250% of the as-deposited film thickness. In the shown embodiment the diffusion barrier layer 124 is about 100 angstroms thick and the contact layer 122 is between 500 and 600 angstroms thick. The thickness of any actual diffusion layer 124 or contact layer 122 may vary along the horizontal axis due to inconsistencies in the substrate topology or the deposition process.

With the new process the improved diffusion barrier material titanium/aluminum/nitride is fabricated without having to use a low throughput reactive sputter process. In addition, the barrier and contact layers are formed in the same annealing step, thereby reducing the overall number of processing steps. Compared to the conventional practice of annealing titanium to form a titanium silicide interface and a titanium nitride diffusion barrier, the process disclosed by the invention provides a more effective barrier more efficiently. The titanium/aluminum/nitride is more effective because it has barrier properties superior to those of other commonly used materials such as titanium nitride. For submicron contacts and vias bottom step coverage is minimal and any added protection greatly enhances the reliability of the circuits.

FIG. 2 shows auger electron spectroscopy (AES) data of 550 angstroms of sputtered titanium-aluminum alloy after a high temperature rapid thermal annealing step. Prior to the high temperature anneal step the titanium-aluminum layer contained approximately 80% titanium and 20% aluminum. The graph of FIG. 2 shows the relative concentrations in the contact layer (from approximately 100 to 1100 angstroms in depth) to be approximately: silicon 40 to 60%; titanium 20 to 30%; nitrogen 20 to 30%; aluminum less than 5%. The graph shows the relative concentrations of the materials in the diffusion layer (from approximately 0 to 100 angstroms in depth) to be approximately: titanium 25 to 55%; nitrogen 40 to 55%; aluminum 0 to 25%.

FIG. 3 shows contact resistance data from three separate one hundred contact strings of p+ contacts. "Control" refers to a deposition of 600 angstroms of titanium using a 1:1 ration aspect collimator. "Experimental" refers to a deposition of 600 angstroms of titanium-aluminum alloy using a non-collimated dual source module. In both cases deposition was followed by a nitrogen ambient rapid thermal annealing step. The data clearly show that low contact resistance can be obtained simultaneous to titanium/aluminum/nitride formation using the new process. The dual source used for the experimental test has poor contact step coverage and it is expected that contact resistance equivalent to control can be obtained if collimated deposition or some alternate high step coverage deposition method is used.

It is to be understood that the above description is intended to be illustrative. and not restrictive. Many other embodiments will be apparent to those of skill in the art upon reviewing the above description. The scope of the invention should. therefore, be determined with reference to the appended claims, along with the full scope of equivalents to which such claims are entitled.

What is claimed is:

1. A process of fabricating a semiconductor device comprising:
   forming a layer comprising an alloy of aluminum and a refractory metal in contact with silicon; and
   nitridizing the alloy to form a layer of aluminum, nitride, and the refractory metal in contact with a silicide of the refractory metal.

2. The process of claim 1 wherein:
   forming a layer comprises forming a layer comprising an alloy of titanium and aluminum; and
   nitridizing the alloy comprises nitridizing the alloy to create a titanium/aluminum/nitride layer.

3. The process of claim 1 wherein:
   forming a layer comprises forming a layer comprising an alloy of tungsten and aluminum; and
   nitridizing the alloy comprises nitridizing the alloy to create a tungsten/aluminum/nitride layer.

4. The process of claim 1 wherein nitridizing the alloy comprises furnace annealing the alloy in a nitrogen-containing gas ambient.

5. The process of claim 1, further comprising:
   preparing a silicon substrate; and
   wherein forming a layer comprises forming a layer comprising an alloy of aluminum and a refractory metal in contact with the silicon substrate.

6. The process of claim 1 wherein:
   forming a layer comprises forming a layer comprising an alloy of tantalum and aluminum; and
   nitridizing the alloy comprises rapid thermal annealing the alloy in a nitrogen-containing gas ambient to create a tantalum/aluminum/nitride layer.

7. The process of claim 6 wherein rapid thermal annealing the alloy comprises rapid thermal annealing the alloy at an annealing temperature between 500 and 900 degrees Celsius.

8. The process of claim 6 wherein rapid thermal annealing the alloy comprises rapid thermal annealing the alloy at an annealing temperature of 700 degrees Celsius for a period between 0.5 and 3 minutes.

9. The process of claim 5 wherein:
   preparing a silicon substrate comprises preparing a substrate of P-doped single crystal silicon; and
   wherein nitridizing the alloy further comprises forming a silicide contact layer interposed between the silicon substrate and a diffusion barrier layer resulting from nitridizing the alloy.

10. A process of fabricating a semiconductor device comprising:
    forming a layer comprising an alloy of tantalum and aluminum in contact with silicon; and
    nitridizing the alloy to create a tantalum/aluminum/nitride layer in contact with tantalum silicide.

11. A process of fabricating a semiconductor device comprising:
    forming a layer comprising an alloy of aluminum and a refractory metal in contact with silicon; and
    rapid thermal annealing the alloy in a nitrogen-containing gas ambient to form a layer of aluminum, nitride, and the refractory metal in contact with a silicide of the refractory metal.

12. The process of claim 11 wherein rapid thermal annealing the alloy comprises rapid thermal annealing the alloy at an annealing temperature between 500 and 900 degrees Celsius.

13. The process of claim 11 wherein rapid thermal annealing the alloy comprises rapid thermal annealing the alloy at an annealing temperature of 700 degrees Celsius.

14. The process of claim 13 wherein rapid thermal annealing the alloy further comprises rapid thermal annealing the alloy for a period between 0.5 and 3 minutes.

15. A process of fabricating a semiconductor device comprising:
    preparing a semiconductor substrate comprising silicon;
    forming a layer comprising an alloy of aluminum and a refractory metal over the semiconductor substrate;
    nitridizing the alloy; and
    forming a silicide contact layer interposed between the semiconductor substrate and a diffusion barrier layer resulting from nitridizing the alloy.

16. The process of claim 15 wherein:
    preparing a semiconductor substrate comprises preparing a P-doped single crystal silicon substrate;
    forming a layer comprises depositing an alloy comprising approximately 20% aluminum atoms and approximately 80% titanium atoms on the silicon substrate; and
    nitridizing the alloy comprises annealing the alloy and the silicon substrate to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

17. A process of fabricating a semiconductor device comprising:
    preparing a semiconductor substrate of P-doped single crystal silicon;
    forming a layer comprising an alloy of aluminum and a refractory metal over the semiconductor substrate;
    nitridizing the alloy; and
    forming a silicide contact layer interposed between the semiconductor substrate and a diffusion barrier layer resulting from nitridizing the alloy.

18. The process of claim 17 wherein:
    forming a layer comprises depositing an alloy comprising approximately 20% aluminum atoms and approximately 80% titanium atoms on the silicon substrate; and
    nitridizing the alloy comprises annealing the alloy and the silicon substrate to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

19. A method for fabricating a semiconductor structure, comprising:
    depositing a first layer on a silicon substrate, the first layer having a thickness and comprising a metal and a refractory metal; and
    annealing the first layer and the silicon substrate to form a diffusion barrier layer and a layer of silicide on the silicon substrate.

20. The method of claim 19 wherein depositing a first layer comprises depositing a first layer on a silicon substrate, the first layer having a thickness and comprising aluminum and titanium.

21. The method of claim 20 wherein annealing the first layer comprises annealing the first layer and the silicon substrate at a temperature between 500 degrees Celsius and 900 degrees Celsius in a nitrogen ambient to form a diffusion barrier layer comprising titanium, aluminum, and nitrogen, and a layer of titanium silicide between the diffusion barrier layer and the silicon substrate.

22. The method of claim 21 wherein annealing the first layer further comprises annealing the first layer and the silicon substrate at 500 degrees Celsius for 5 minutes.

23. The method of claim 21 wherein annealing the first layer further comprises annealing the first layer and the silicon substrate at 700 degrees Celsius for between 0.5 and 3 minutes.

24. The method of claim 21 wherein annealing the first layer further comprises annealing the first layer and the silicon substrate in a furnace.

25. The method of claim 21, further comprising:
fabricating the silicon substrate from P-doped single crystal silicon; and
wherein annealing the first layer further comprises annealing the first layer and the silicon substrate to form the diffusion barrier layer having a thickness of approximately 20 percent of the thickness of the first layer, and to form the layer of titanium silicide having a thickness of approximately 100 to 250 percent of the thickness of the first layer.

26. A method for fabricating an electronic device, comprising:
depositing a first layer on a silicon substrate, the first layer having a thickness and comprising aluminum and a refractory metal; and
annealing the first layer and the silicon substrate to form a diffusion barrier layer and a layer of silicide on the silicon substrate.

27. The method of claim 26 wherein:
depositing a first layer comprises depositing a first layer on a silicon substrate, the first layer having a thickness and comprising aluminum and titanium; and
annealing the first layer comprises annealing the first layer and the silicon substrate at a temperature between 500 degrees Celsius and 900 degrees Celsius in a nitrogen ambient to form a diffusion barrier layer comprising aluminum, titanium, and nitrogen, and a layer of titanium silicide between the diffusion barrier layer the silicon substrate.

28. The method of claim 27 wherein annealing the first layer further comprises annealing the first layer and the silicon substrate at 500 degrees Celsius for 5 minutes.

29. The method of claim 27 wherein annealing the first layer further comprises annealing the first layer and the silicon substrate at 700 degrees Celsius for between 0.5 and 3 minutes.

30. The method of claim 27 wherein annealing the first layer further comprises annealing the first layer and the silicon substrate in a furnace.

31. The method of claim 27, further comprising:
fabricating the silicon substrate from P-doped single crystal silicon; and
wherein annealing the first layer further comprises annealing the first layer and the silicon substrate to form the diffusion barrier layer having a thickness of approximately 20 percent of the thickness of the first layer, and to form the layer of titanium silicide having a thickness of approximately 100 to 250 percent of the thickness of the first layer.

32. The method of claim 26 wherein:
depositing a first layer comprises depositing a first layer on a P-doped single crystal silicon substrate, the first layer comprising approximately 20% aluminum atoms and approximately 80% titanium atoms; and
annealing the first layer comprises annealing the first layer and the silicon substrate to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

33. A method for fabricating a semiconductor device, comprising:
depositing a first layer on a silicon substrate, the first layer having a thickness and comprising aluminum and titanium; and
annealing the first layer and the silicon substrate at a temperature between 500 degrees Celsius and 900 degrees Celsius in a nitrogen ambient to form a diffusion barrier layer comprising aluminum, titanium, and nitrogen, and a layer of titanium silicide between the diffusion barrier layer and the silicon substrate.

34. The method of claim 33 wherein annealing the first layer further comprises annealing the first layer and the silicon substrate at 500 degrees Celsius for 5 minutes.

35. The method of claim 33 wherein annealing the first layer further comprises annealing the first layer and the silicon substrate at 700 degrees Celsius for between 0.5 and 3 minutes.

36. The method of claim 33 wherein annealing the first layer further comprises annealing the first layer and the silicon substrate in a furnace.

37. The method of claim 33, further comprising:
fabricating the silicon substrate from P-doped single crystal silicon; and
wherein annealing the first layer further comprises annealing the first layer and the silicon substrate to form the diffusion barrier layer having a thickness of approximately 20 percent of the thickness of the first layer, and to form the layer of titanium silicide having a thickness of approximately 100 to 250 percent of the thickness of the first layer.

38. A method comprising:
depositing a first layer on a silicon substrate, the first layer comprising aluminum and titanium; and
annealing the first layer and the silicon substrate to form a diffusion barrier layer and a layer of silicide on the silicon substrate.

39. The method of claim 38 wherein:
depositing a first layer comprises depositing a first layer on a P-doped single crystal silicon substrate, the first layer comprising approximately 20% aluminum atoms and approximately 80% titanium atoms; and
annealing the first layer comprises annealing the first layer and the silicon substrate to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

40. A method comprising:

depositing a first layer on a silicon substrate, the first layer comprising aluminum and titanium; and annealing the first layer and the silicon substrate at 500 degrees Celsius for 5 minutes in a nitrogen ambient to form a diffusion barrier layer and a layer of silicide on the silicon substrate.

41. The method of claim 40 wherein:

depositing a first layer comprises depositing a first layer on a P-doped single crystal silicon substrate, the first layer comprising approximately 20% aluminum atoms and approximately 80% titanium atoms; and annealing the first layer comprises annealing the first layer and the silicon substrate at 500 degrees Celsius for 5 minutes in a nitrogen ambient to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

42. A method comprising:

depositing a first layer on a silicon substrate, the first layer comprising aluminum and titanium; and annealing the first layer and the silicon substrate at 700 degrees Celsius for between 0.5 and 3 minutes in a nitrogen ambient to form a diffusion barrier layer and a layer of silicide on the silicon substrate.

43. The method of claim 42 wherein:

depositing a first layer comprises depositing a first layer on a P-doped single crystal silicon substrate, the first layer comprising approximately 20% aluminum atoms and approximately 80% titanium atoms; and annealing the first layer comprises annealing the first layer and the silicon substrate at 700 degrees Celsius for between 0.5 and 3 minutes in a nitrogen ambient to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

44. A method comprising:

depositing a first layer on a silicon substrate, the first layer comprising approximately 20% aluminum atoms and approximately 80% titanium atoms; and annealing the first layer and the silicon substrate to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

45. The method of claim 44 wherein depositing a first layer further comprises depositing the first layer on a P-doped single crystal silicon substrate.

46. A method comprising:

depositing a first layer on a silicon substrate, the first layer comprising approximately 20% aluminum atoms and approximately 80% titanium atoms; and annealing the first layer and the silicon substrate at 500 degrees Celsius for 5 minutes in a nitrogen ambient to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

47. The method of claim 46 wherein depositing a first layer further comprises depositing the first layer on a P-doped single crystal silicon substrate.

48. A method comprising:

depositing a first layer on a silicon substrate, the first layer comprising approximately 20% aluminum atoms and approximately 80% titanium atoms; and annealing the first layer and the silicon substrate at 700 degrees Celsius for between 0.5 and 3 minutes in a nitrogen ambient to form a diffusion barrier layer comprising 25 to 55% titanium atoms, 40 to 55% nitrogen atoms, and 1 to 25% aluminum atoms, and a layer of silicide comprising 40 to 60% silicon atoms, 20 to 30% titanium atoms, 20 to 30% nitrogen atoms, and less than 5% aluminum atoms, on the silicon substrate.

49. The method of claim 48 wherein depositing a first layer further comprises depositing the first layer on a P-doped single crystal silicon substrate.

* * * * *

UNITED STATES PATENT AND TRADEMARK OFFICE
CERTIFICATE OF CORRECTION

PATENT NO. : 6,218,295 B1
DATED : April 17, 2001
INVENTOR(S) : Meikle et al.

Page 1 of 1

It is certified that error appears in the above-identified patent and that said Letters Patent is hereby corrected as shown below:

Column 1,
Line 8, delete "420application" and insert -- 420 application --, therefor.

Column 2,
Line 32, delete "suicide" and insert -- silicide --, therefor.
Line 37, delete "silicide.," and insert -- silicide, --, therefor.

Column 3,
Line 14, delete "y-et" and insert -- yet --, therefor.
Line 45, delete "p+contacts" and insert -- p+ contacts --, therefor.

Column 4,
Line 14, delete "10" between "of" and "titanium".
Line 67, delete "illustrative." and insert -- illustrative, --, therefor.

Signed and Sealed this

Thirteenth Day of November, 2001

Attest:

NICHOLAS P. GODICI
*Attesting Officer*   *Acting Director of the United States Patent and Trademark Office*